US009508541B2

(12) United States Patent
Lee et al.

(10) Patent No.: US 9,508,541 B2
(45) Date of Patent: Nov. 29, 2016

(54) APPARATUS AND METHOD FOR TREATING SUBSTRATE

(71) Applicant: PSK INC., Gyeonggi-do (KR)

(72) Inventors: Jongjin Lee, Gyeonggi-do (KR); Bum Joon Park, Gyeonggi-do (KR); Tae Hoon Kim, Gyeonggi-do (KR); Chang Weon Lee, Gyeonggi-do (KR); Sunwoong Yim, Gyeonggi-do (KR); Han Kyu Lee, Gyeonggi-do (KR)

(73) Assignee: PSK INC., Gyeonggi-do (KR)

( * ) Notice: Subject to any disclaimer, the term of this patent is extended or adjusted under 35 U.S.C. 154(b) by 366 days.

(21) Appl. No.: 14/146,314

(22) Filed: Jan. 2, 2014

(65) Prior Publication Data
US 2014/0190513 A1    Jul. 10, 2014

(30) Foreign Application Priority Data

Jan. 4, 2013 (KR) ........................ 10-2013-0001197
Jun. 17, 2013 (KR) ........................ 10-2013-0069078

(51) Int. Cl.
| | |
|---|---|
| *B08B 6/00* | (2006.01) |
| *H01L 21/02* | (2006.01) |
| *H01J 37/32* | (2006.01) |
| *H01L 21/673* | (2006.01) |
| *H01L 21/677* | (2006.01) |
| *H01L 21/687* | (2006.01) |
| *H01L 21/683* | (2006.01) |

(52) U.S. Cl.
CPC ... *H01L 21/02046* (2013.01); *H01J 37/32192* (2013.01); *H01J 37/32779* (2013.01); *H01L 21/02076* (2013.01); *H01L 21/67383* (2013.01); *H01L 21/67766* (2013.01); *H01L 21/6835* (2013.01); *H01L 21/6836* (2013.01); *H01L 21/68707* (2013.01); *H01L 2221/6834* (2013.01); *H01L 2221/68327* (2013.01)

(58) Field of Classification Search
None
See application file for complete search history.

(56) References Cited

FOREIGN PATENT DOCUMENTS

| | | |
|---|---|---|
| JP | 2001-308077 A | 11/2001 |
| JP | 2002-289665 A | 10/2002 |
| JP | 2004-055703 A | 2/2004 |
| JP | 2005-332982 A | 12/2005 |
| JP | 2007-281095 A | 10/2007 |
| JP | 2009-033156 A | 2/2009 |
| JP | 2009-059763 A | 3/2009 |
| JP | 2009-094436 A | 4/2009 |
| JP | 2010-003748 A | 1/2010 |
| JP | 2010-258288 A | 11/2010 |
| JP | 2012-248741 A | 12/2012 |
| JP | 2013004666 A | 1/2013 |
| KR | 1020100053250 A | 5/2010 |
| KR | 1020100072059 A | 6/2010 |
| KR | 1020100119208 A | 11/2010 |
| KR | 1020120022591 A | 3/2012 |
| KR | 101101710 B1 | 5/2012 |
| KR | 1020120076410 A | 7/2012 |

*Primary Examiner* — Eric Golightly
(74) *Attorney, Agent, or Firm* — Carter, DeLuca, Farrell & Schmidt, LLP

(57) ABSTRACT

Provided is a substrate treatment apparatus. The substrate treatment apparatus includes a load port on which a carrier accommodating a plurality of substrates to which a background wafer is attached to a mounting tape fixed to a frame ring is placed, a plasma treatment unit supplying plasma to treat a top surface of the wafer, and a substrate transfer unit transferring the substrate between the carrier and the plasma treatment unit.

9 Claims, 10 Drawing Sheets

APPARATUS AND METHOD FOR TREATING SUBSTRATE

CROSS-REFERENCE TO RELATED APPLICATIONS

This U.S. non-provisional patent application claims priority under 35 U.S.C. §119 of Korean Patent Application Nos. 10-2013-0001197, filed on Jan. 4, 2013, and 10-2013-0069078, filed on Jun. 17, 2013, the entire contents of which are hereby incorporated by reference.

BACKGROUND OF THE INVENTION

The present invention disclosed herein relates to an apparatus and method for treating a substrate, and more particularly, to an apparatus and method for treating a substrate by using plasma.

Since a wafer on which a front end of line (EFOL) process is performed is unnecessarily thick, a back grinding process may be required to reduce a thickness of the wafer. However, it is not easy to handle the wafer due to the very thin wafer. Thus, a carrier may be attached to the wafer by using an adhesive so as to handle the wafer. The carrier may be removed after chip bonding, underfill, and molding processes that are following processes are performed. After the carrier is removed, the wafer may be handled in a state where the wafer is attached to a mounting tape fixed to a frame ring. The mounting tape may allow the wafer to be easily handled as well as prevent individual chips of the wafer from being scattered when the wafer is divided into the individual chips.

The adhesive may not be completely removed from the wafer from which the carrier is removed, but partially remain on the wafer. For this, a plasma treating process may be additionally performed. When the plasma treating process is performed, the mounting tape as wall as the wafer may be exposed to plasma. As a result, since the mounting tape is deformed by the plasma, the handling of the wafer may not be easy, and also the tape may not be easily removed to partially remain on the wafer.

SUMMARY OF THE INVENTION

The present invention provides a substrate treatment apparatus that is capable of easily removing an adhesive attached to a wafer.

The present invention also provides a substrate treatment apparatus that is capable of preventing a mounting tape from being deformed.

The present invention also provides a substrate treatment apparatus that is capable of easily handling a wafer attached to a mounting tape.

The object of the present invention is not limited to the aforesaid, but other objects not described herein will be clearly understood by those skilled in the art from descriptions below.

Embodiments of the present invention provide substrate treatment apparatuses including: a load port on which a carrier accommodating a plurality of substrates to which a back-ground wafer is attached to a mounting tape fixed to a frame ring is placed; a plasma treatment unit supplying plasma to treat a top surface of the wafer; and a substrate transfer unit transferring the substrate between the carrier and the plasma treatment unit.

In some embodiments, the plasma treatment unit may include: a process chamber having an inner space; a susceptor disposed within the process chamber to support each of the substrates; a plasma supply part supplying plasma into the process chamber; and a blocking member covering the mounting tape to prevent the mounting tape from being exposed to the plasma.

In other embodiments, the blocking member may include: a blocking ring covering a region between the wafer and the frame ring, the blocking ring non-contacting the mounting tape; and an elevation member elevating the blocking ring.

In still other embodiments, the blocking ring may include: a body having a ring shape to face the mounting tape; an inner portion extending downward from the inside of the body, the inner portion having an end contacting an edge of the wafer; and an outer portion extending downward from the outside of the body, the outer portion having an end contacting the frame ring.

In even other embodiments, the blocking ring may include: a body having a ring shape to face the mounting tape; an inner portion extending downward from the inside of the body, the inner portion being spaced a predetermined distance from the top surface of the wafer; and an outer portion extending downward from the outside of the body, the outer portion having an end contacting the frame ring.

In yet other embodiments, the blocking ring may have a width that covers a region from the edge of the wafer to an outer edge of the frame ring.

In further embodiments, the blocking ring may be formed of a ceramic material.

In still further embodiments, the elevation member may include: a first rod supporting the blocking ring; a second rod disposed on a lower portion of the first rod to support the first rod, the second rod having an inner space in which the first rod is elevatable; a third rod disposed on a lower portion of the second rod to support the second rod, the third rod having an inner space in which the second rod is elevatable; and a driver individually driving the first and second rods, wherein a support piece for seating the substrate on the susceptor in a state where the support piece supports the frame ring may be disposed on the second rod, and an accommodation space in which the support piece is vertically movable may be defined in an edge of the susceptor.

In even further embodiments, the accommodation space may be defined inward from an outer surface of the susceptor up to a point at which an edge of the wafer is disposed.

In yet further embodiments, the substrate transfer unit may include a transfer robot including a hand part for grasping a portion of the frame ring in a tong manner, the transfer robot transferring the substrate.

In much further embodiments, the hand part may include: a lower hand on which a portion of the frame ring is placed; an upper hand disposed above the lower hand, the upper hand pressing the frame ring placed on the lower hand to fix the frame ring; and a driver moving the upper hand so that the upper hand is spread or folded with respect to the lower hand.

In still much further embodiments, a front end of the lower hand may have an arc shape having the same curvature as the frame ring.

In other embodiments of the present invention, substrate treatment apparatuses include: a process chamber having an inner space; a susceptor disposed within the process chamber and on which a substrate to which a back-ground wafer is attached to a mounting tape fixed to a frame ring is placed; a plasma supply part supplying a plasma gas into the process chamber; a blocking ring covering the mounting tape exposed to the outside in a region of the substrate placed on the susceptor; and an elevation member elevating the blocking ring.

In some embodiments, the blocking ring may cover a region between the wafer and the frame ring in the region of the substrate and non-contact mounting tape.

In other embodiments, the blocking ring may have a width that covers a region from an edge of the wafer to an outer edge of the frame ring.

In still other embodiments, the blocking ring may have an inner end contacting a top surface of the wafer and an outer end contacting a top surface of the frame ring.

In even other embodiments, the blocking ring may have an inner end spaced a predetermined distance from a top surface of the wafer and an outer end contacting a top surface of the frame ring.

In yet other embodiments, the elevation member may include: a moving rod, an upper end of the moving rod coupled to the blocking ring; and a driver elevating the moving rod, wherein a support piece supporting the frame ring and descending together with the moving rod to seat the substrate on the susceptor may be coupled to the moving rod, and an accommodation space in which the support piece is elevatable may be defined in an edge of the susceptor.

In still other embodiments of the present invention, substrate treatment methods include: transferring a substrate, to which a back-ground wafer is attached to a mounting tape fixed to a frame ring, into a process chamber; seating the substrate on a susceptor disposed within the process chamber; and supplying plasma into the process chamber to treat a top surface of the wafer.

In some embodiments, the substrate placed on the susceptor may be covered by a blocking ring to prevent the mounting tape from being exposed to the plasma.

In other embodiments, the blocking ring may have a ring shape to cover a region between the wafer and the frame ring.

In still other embodiments, the blocking ring may cover a region from an edge of the wafer to an outer edge of the frame ring.

In even other embodiments, the blocking ring may have an inner end contacting the wafer.

In yet other embodiments, the blocking ring may have an inner end spaced a predetermined distance from the wafer.

In further embodiments, the seating of the substrate on the susceptor may include falling a support piece down as a moving rod descends in a state where the frame ring is placed on the support piece coupled to the moving rode elevating the blocking ring.

In still further embodiments, the transfer robot may transfer the substrate in a state where a hand part grasps a portion of the frame ring in a tong manner.

In even other embodiments of the present invention, apparatus for treating a substrate to which a back-ground wafer is attached to a mounting tape fixed to a frame ring include a transfer robot including a hand part grasping a portion of the frame ring in a tong manner, the transfer robot transferring the substrate.

In yet other embodiments of the present invention, methods for treating substrates to which a back-ground wafer is attached to a mounting tape fixed to a frame ring include allowing a hand part of a transfer robot to pick-up one of the substrates from a carrier in which the substrates are stacked, wherein the hand part grasps a portion of the frame ring in a tong manner to pick-up the substrates.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION OF PREFERRED EMBODIMENTS

Figure 1:
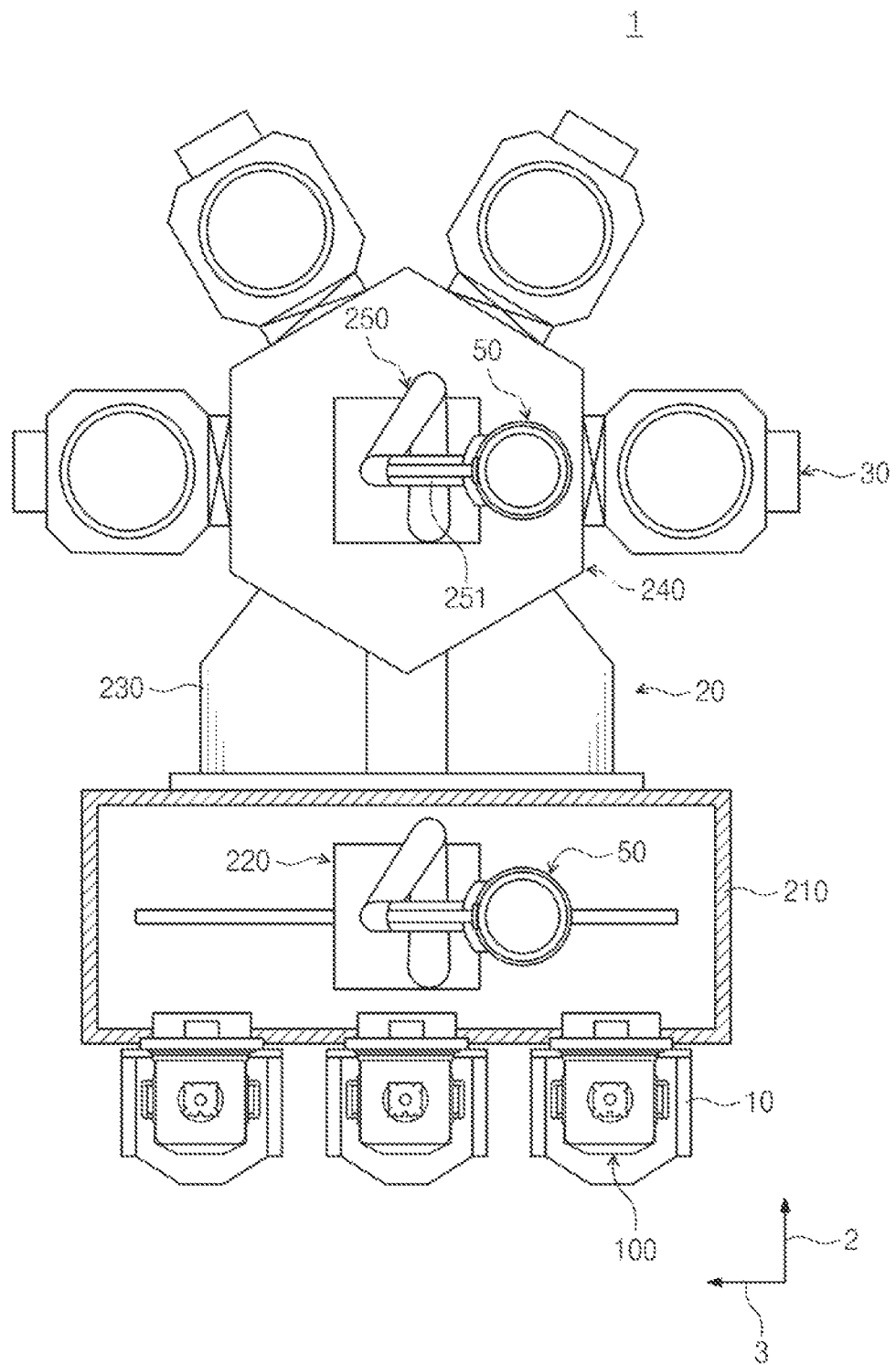
FIG. 1 is a schematic plan view of a substrate treatment apparatus according to an embodiment of the present invention.

Preferred embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art. In the drawings, the thicknesses of layers and regions are exaggerated for clarity.

FIG. 1 is a schematic plan view of a substrate treatment apparatus according to an embodiment of the present invention.

Referring to FIG. 1, a substrate treatment apparatus 1 includes a load port 10, a substrate transfer unit 20, and a plasma treatment unit 30. The load port 10, the substrate transfer unit 20, and the plasma treatment unit 30 are successively arranged in one direction. Hereinafter, the direction in which the load port 10, the substrate transfer unit 20, and the plasma treatment unit 30 are arranged will be defined as a first direction 2, and a direction perpendicular to the first direction 2 when viewed from an upper side will be defined as a second direction 3.

The load port 10 is disposed on a front side of the substrate transfer unit 20. Also, a plurality of load ports 10 are spaced apart from each other and arranged in a line along the second direction 3. Carriers 100 (e.g., a cassette, a front opening unified pod (FOUP), and the like) are seated on the load ports 10, respectively. Substrates 50 to be treated and treated substrates 50 are accommodated into the carriers 100. According to an embodiment, each of the substrates 50 may be provided with a structure in which a back-ground wafer is attached to a mounting tape fixed to a frame ring.

Figure 2:
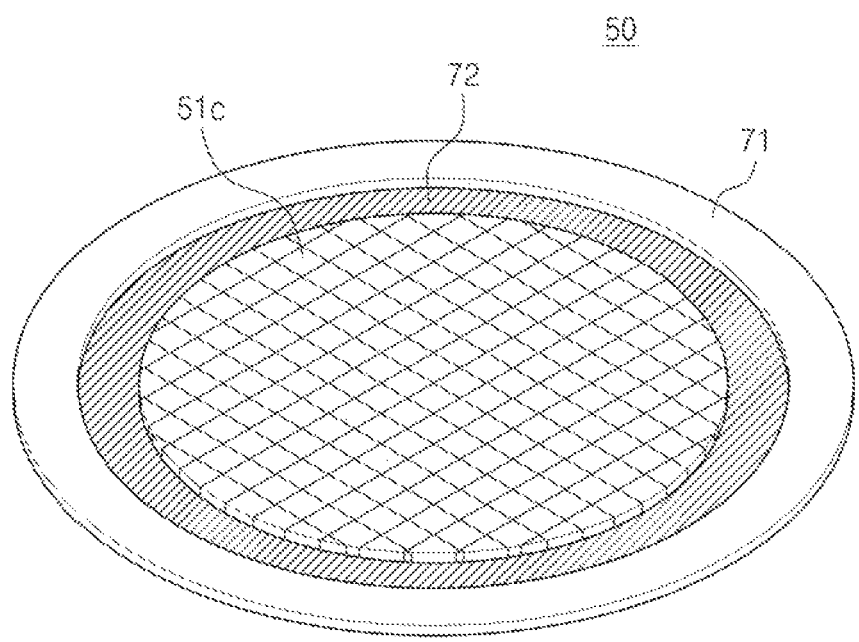
FIG. 2 is a perspective view of a substrate provided in the substrate treatment apparatus according to an embodiment of the present invention.
Figure 3:
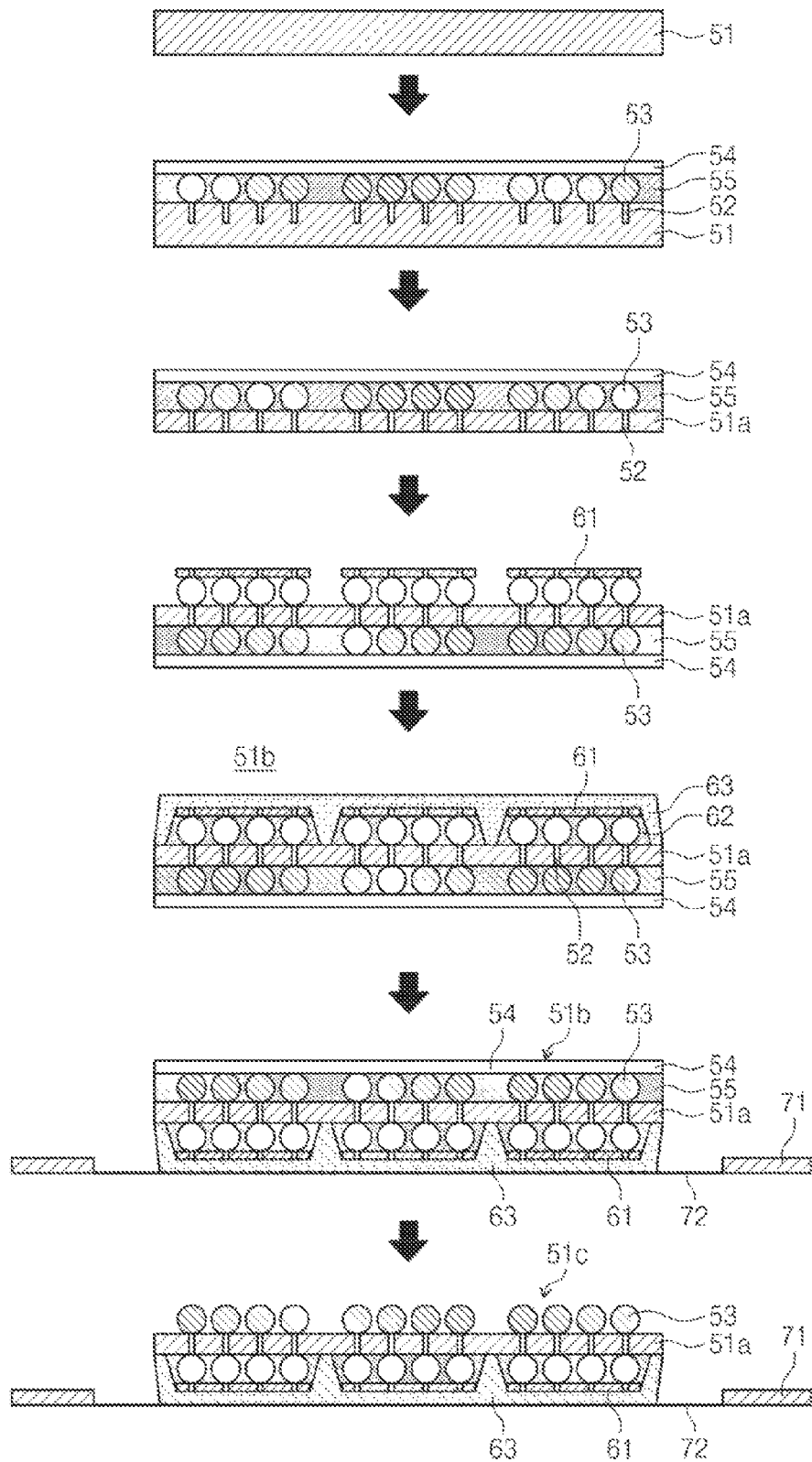
FIG. 3 is a view illustrating a process for manufacturing the substrate of FIG. 2.

FIG. 2 is a perspective view of a substrate provided in the substrate treatment apparatus according to an embodiment of the present invention, and FIG. 3 is a view illustrating a process for manufacturing the substrate of FIG. 2.

Referring to FIGS. 2 and 3, a wafer 51 on which a front end of line (FEOL) process is performed is provided as shown in FIG. 3A. As shown in FIG. 3B, a through silicon via (TSV) 52 and a bump 53 are successively formed in/on the wafer 51, and then a carrier 54 adheres to the wafer 51. The carrier 54 may include a plate formed of a silicon or glass material. When a back grinding process is performed on the wafer 51, it may be difficult to handle the wafer 51 because the wafer 51 has a thin thickness. Thus, the carrier 54 may be provided to easily handle the wafer 51. The carrier 54 adheres to a top surface of the wafer 51 by using an adhesive 55.

The back grinding process may be performed on the wafer 51 to which the carrier 54 is attached to reduce an assembly size of a package. Since the wafer 51 on which the FEOL process is performed is unnecessarily thick, a back surface of the wafer 51 may be thinly ground through the back grinding process as shown in FIG. 3C.

After the back grinding process is performed, the wafer 51a is flipped and chip-bonded 61 as shown in FIG. 3D. Then, as shown in FIG. 3E, an underfill process 62 and a molding process 63 are successively performed.

The wafer 51b on which the molding process 63 is performed may be attached to a mounting tape 72 fixed to a frame ring 71 as shown in FIG. 3F. The frame ring 71 has a ring shape with a radius greater than that of the wafer 51b and is formed of a stainless or SUS material. The mounting tape 72 may be a film having a thin thickness. Thus, since it is difficult to support the wafer 51b by using only the film, the mounting tape 72 is fixed to the frame ring 71. The mounting tape 72 is constituted by three layers, e.g., a base film, an adhesion layer adhering to the wafer 51b, and a protection film protecting the adhesion layer. Since the frame ring 71 has a radius greater than that of the wafer 51b, the mounting tape 72 may be exposed to the outside in a region between the frame ring 71 and the wafer 52b when viewed from an upper side.

After the wafer 52b is attached to the mounting tape 72, the carrier 54 is removed as shown in FIG. 3G. When the carrier 54 is removed, the mounting tape 72 may temporarily serve as the carrier 54. Here, the wafer 51c is provided for the process in the state where the wafer 51c is attached to the mounting tape 72. The frame ring 71 and the mounting tape 72 may facilitate the handling of the wafer 51c. Also, the mounting tape 72 may prevent chips from being scattered or lost by using the adhesion force therebetween when the wafer 51c is diced and then divided into the individual chips.

An adhesive 55a may remain on the top surface of the wafer 51c from which the carrier 54 is removed. Thus, an additional process for removing the remaining adhesive 55a is required. The plasma treatment unit 30 performs a process for removing the adhesive 55a remaining on the wafer 51c by using plasma.

Figure 4:
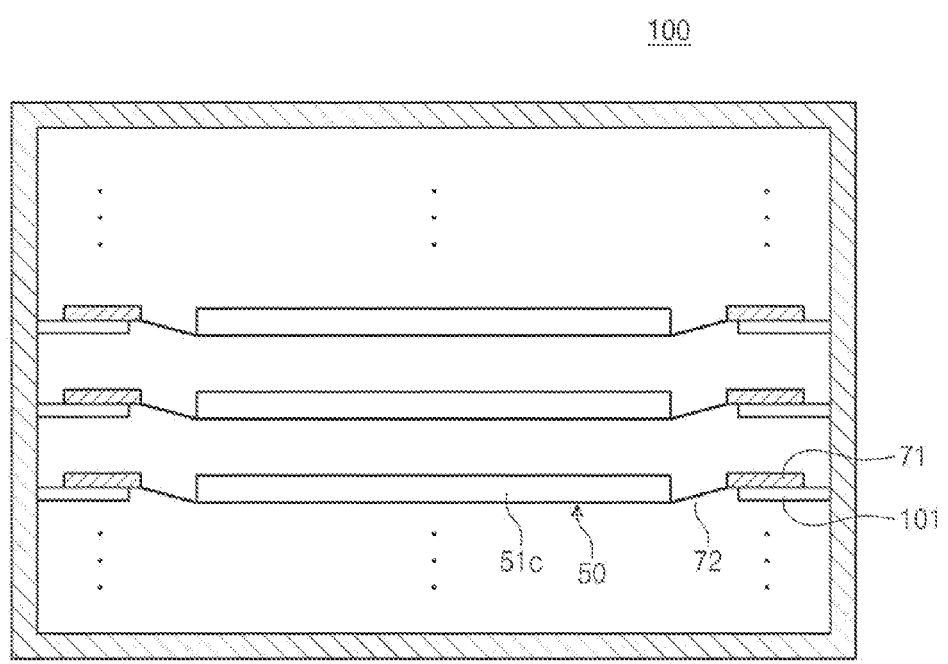
FIG. 4 is a view of a state in which substrates are accommodated into a carrier according to an embodiment of the present invention.

FIG. 4 is a view of a state in which substrates are accommodated into a carrier according to an embodiment of the present invention.

Referring to FIG. 4, slots 101 are coupled to both sidewalls of the inside of a carrier 100. The slots 101 are vertically arranged at a predetermined distance. The substrates 50 are accommodated in a state where both sides of the frame ring 71 are seated on the slots 101. The mounting tape 72 may droop downward by a self-weight of the wafer 51c.

Referring again to FIG. 1, the substrate transfer unit 20 transfers a substrate between the carrier and the substrate treatment unit 30. The substrate transfer unit 20 includes a frame 210, a first transfer robot 220, a loadlock chamber 230, a transfer chamber 240, and a second transfer robot 250.

The frame 210 is disposed between the load port 10 and the loadlock chamber 230. The first transfer robot 220 is disposed within the frame 210. The first transfer robot 220 transfers the substrate 50 between the carrier 100 and the loadlock chamber 230.

Figure 5:
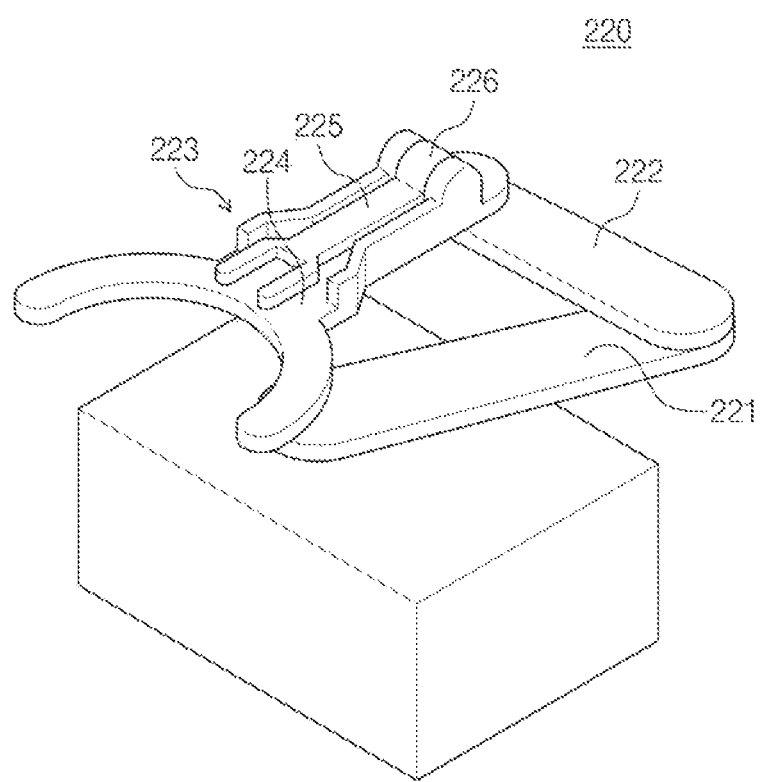
FIG. 5 is a view of a first transfer robot according to an embodiment of the present invention.
Figure 6:
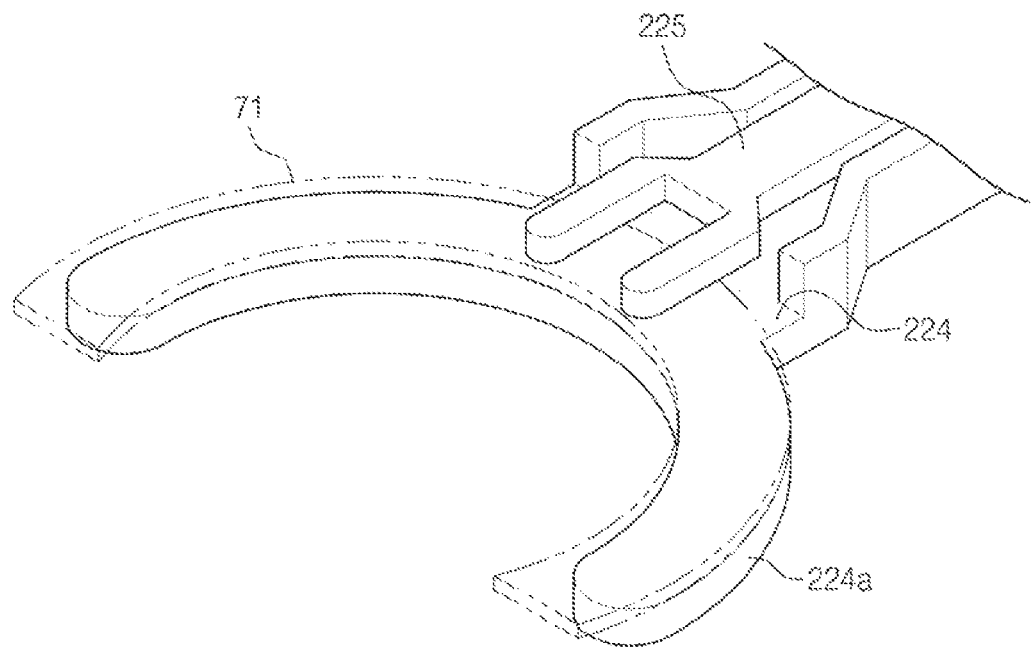
FIG. 6 is a view of a hand part of FIG. 5.

FIG. 5 is a view of a first transfer robot according to an embodiment of the present invention, and FIG. 6 is a view of a hand part of FIG. 5.

Referring to FIGS. 5 and 6, the first transfer robot 220 has a structure in which a plurality of arms are rotatable with respect to each other. A hand part 223 is disposed on an upper end of the first transfer robot 220. The hand part 223 has a structure for grasping the frame ring 71 in a tong manner. The hand part 223 includes a lower hand 224, an upper hand 225, and a driver 226.

A portion of the frame ring 71 is placed on the lower hand 224. A front end of the lower hand 224 include an arc-shaped support frame 224a having the same curvature as the frame ring 71. Since a portion of the frame ring 71 is placed on the support frame 224a, the frame ring 71 may be stably supported.

The upper hand 225 is disposed on the lower hand 224 to press the frame ring 71 placed on the lower hand 224, thereby fixing the substrate 50. A front end of the upper hand 225 may have a horseshoe shape. The upper hand 225 is rotatably coupled to the lower hand 224. Thus, the upper hand 225 may be spread or folded with respect to the lower hand to grasp the frame ring 71.

The driver 226 may move the upper hand 225 with respect to the lower hand 224 so that the upper hand 225 and the lower hand 224 grasp the frame ring 71 or release the grasping of the frame ring 71. When the upper hand 225 is axially coupled to the lower hand 224, the driver 226 rotates the upper hand 225 by using a shaft as a rotation center. On the other hand, when a rear end of the upper hand 225 is coupled to a rod (not shown) that is vertically movable, the driver 226 may lift the rod to move the upper hand 225.

Figure 7:
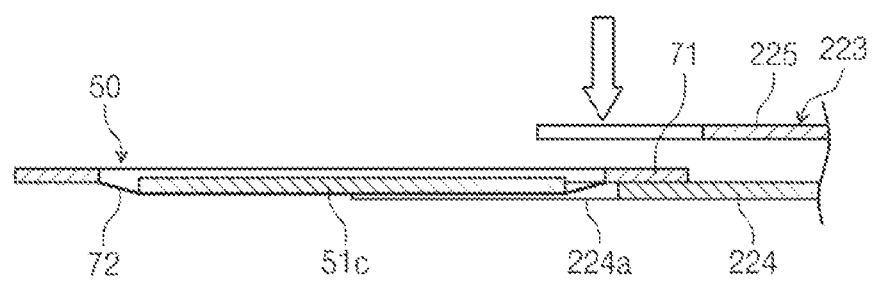
FIG. 7 is a view illustrating a process for grasping the substrate by using the hand part.

FIG. 7 is a view illustrating a process for grasping the substrate by using the hand part.

Referring to FIG. 7, the lower hand 224 of the hand part 223 enters into a lower side of the frame ring 71. Since a front end 224a of the lower hand 224 has the same curvature as the frame ring 71, the front end of the lower hand 224 may be disposed under the frame ring 71 along a portion of the frame ring 71. The upper hand 223 may descend by an operation of the driver 226, and thus the front end of the upper hand 223 presses a top surface of the frame ring 71. The frame ring 71 is supported by the lower hand 224 and pressed by the upper hand 225 and thus is grasped. The hand part 223 picks up the substrate 50 in the state where the hand part 223 grasps the frame ring 71 and then is retreated to the outside of the carrier 100.

According to an embodiment, the entry of the lower hand 224 into the low side of the wafer 51c may be restricted. Since the mounting tape 72 droops downward by the self-weight of the wafer 51c, the wafer 51c may be disposed at a height lower than that of the frame ring 71. When the front end 224a of the lower hand 224 enters up to the lower side of the wafer 51c, the front end 224a of the lower hand 224 may collide with the wafer 51c during the entry of the lower hand 224a. According to the present invention, since the front end 224a of the lower hand 224 enters up to a lower side of the frame ring 71, collision of the hand part 223 with the wafer 51c may be prevented.

Referring again to FIG. 1, the loadlock chamber 230 is disposed between the transfer chamber 240 and the frame 210. The substrates 50 are stacked within the loadlock chamber 230. The loadlock chamber 230 provides a space in which the substrate 50 to be treated stands by before being transferred into the plasma treatment unit 30 or the treated substrate 50 stands by before being transferred into the carrier 100. The loadlock chamber 230 may be provided in one or plurality. According to an embodiment, two loadlock chambers 230 are provided. The substrate 50 to be provided into the plasma treatment unit 30 to perform the treatment process may be accommodated into one loadlock chamber 230, and the substrate 50 treated in the plasma treatment unit 30 may be accommodated into the other loadlock chamber 230.

The transfer chamber 240 is disposed on a rear side of the loadlock chamber 230 along the first direction 2 and includes a main body having a polygonal shape when viewed from an upper side. The loadlock chambers 230 and the plurality of plasma treatment units 30 are disposed outside the main body along a circumference of the main body. According to an embodiment, the transfer chamber 240 may include a main body having a pentagonal shape when viewed from the upper side. The loadlock chambers 230 are disposed on two sidewalls adjacent to the frame 210, respectively. Also, the plasma treatment units 30 are disposed on the rest sidewalls, respectively. A passage (not shown) for loading or unloading the substrate 50 is defined in each of the sidewalls of the main body 240. The passage provides a space through which the substrate 50 is transferred between the transfer chamber 240 and the loadlock chamber 20 or between the transfer chamber 240 and the process chamber 30. A door (not shown) for opening or closing the passage is provided in the passage. The transfer chamber 240 may have various shapes according to a required process module.

The second transfer robot 250 is disposed within the transfer chamber 240. The second transfer robot 250 may transfer the non-treated substrate 50 staying in the loadlock chamber 230 into the plasma treatment unit 30 or transfer the substrate 50 treated in the plasma treatment unit 30 into the loadlock chamber 230. The second transfer robot 250 may successively provide the substrate 50 into the plasma treatment units 30. The second transfer robot 250 may grasp the substrate 50 in the same manner as the first transfer robot 220. The second transfer robot 250 transfers the substrate 50 in the state where the hand part 261 grasps the frame ring 71 in a tong manner. The hand part 251 of the second transfer robot 250 may have the same structure as the hand part (see reference numeral 233 of FIG. 5) of the first transfer robot 220.

The plasma treatment unit 30 may supply plasma to remove the adhesive 55a remaining on the wafer 51c.

Figure 8:
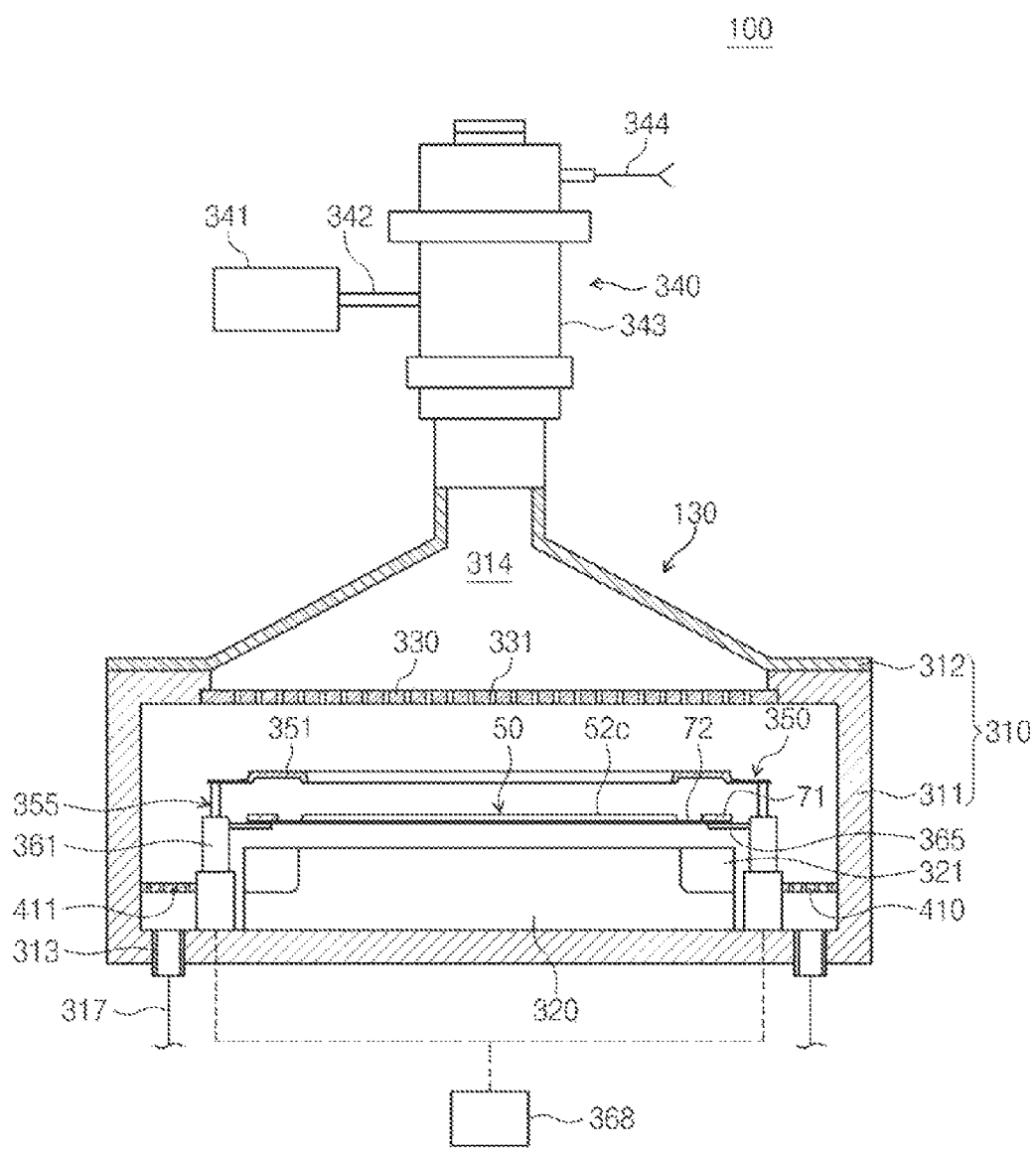
FIG. 8 is a view of a plasma treatment unit according to an embodiment of the present invention.

FIG. 8 is a view of the plasma treatment unit according to an embodiment of the present invention. Referring to FIG. 8, the plasma treatment unit 50 includes a process chamber 310, a susceptor 320, a shower head 330, a plasma supply part 340, and a blocking member 350.

The process chamber 310 provides a space in which the treatment process is performed. The process chamber 310 includes a body 311 and a sealing cover 312. The body 311 has an opened top surface and an inner space. An opening (not shown) through which the substrate 50 is loaded or unloaded is defined in a sidewall of the body 311. The opening is opened or closed by a switching member such as a slit door (not shown). The switching member may close the opening while the substrate 50 is treated within the process chamber 310 and opens the opening when the substrate 50 is loaded into and unloaded from the process chamber 310. In the state where the opening is opened, the hand part 251 of the second transfer robot 250 may enter into the process chamber 310.

An exhaust hole 313 is defined in a lower wall of the body 311. The exhaust hole 313 is connected to an exhaust line 317. An inner pressure of the process may be adjusted through the exhaust line 317, and byproducts generated during the process may be exhausted to the outside of the process chamber 310.

The sealing cover 312 is coupled to an upper wall of the body 311 to cover the opened top surface of the body 311, thereby sealing the inside of the body 311. The sealing cover 312 has an upper end connected to the plasma supply part 340. A diffusion space 314 is defined in the sealing cover 312. The diffusion space 314 may have a width that gradually increases toward the shower head 330 and thus have an inverted hopper shape.

The susceptor 320 is disposed within the process chamber 310. The substrate 50 is placed on a top surface of the susceptor 320. The susceptor 320 may provide an electrostatic chuck for adsorbing the substrate 50 by using electrostatic force. An accommodation space 321 is defined in an edge area of the susceptor 320. The accommodation space 321 is recessed inward from an outer surface of the susceptor 320. The accommodation space 321 may be defined inside the susceptor 320 up to a point of the susceptor 320 on which an edge of the wafer 52c is placed. The accommodation space 321 may be provided in plurality along a circumference of the susceptor 320. According to an embodiment, the accommodation space 321 may be provided in two on one side of the susceptor 320 and in two on the other side of the susceptor 320 that is symmetrical to the one side. The accommodation space 321 may provide a space in which a support piece 365 that will be described later is vertically movable.

A cooling passage (not shown) in which a cooling fluid is circulated is defined in the susceptor 320. The cooling fluid may be circulated along the cooling passage to cool the susceptor 320 and the substrate 50. An increase in temperature of the wafer 52c during the plasma treatment process may be prevented by the circulation of the cooling fluid.

The shower head 330 is coupled to the upper wall of the body 311 by using a coupling member. The shower head 330 has a disk shape and is disposed in parallel with the top surface of the susceptor 320. The shower head 330 may be formed of an aluminum material, and then a surface of the shower head 330 may be oxidized. Distribution holes 331 are defined in the shower head 330. The distribution holes 331 are concentrically defined at a predetermined distance. The plasma diffused in the diffusion space 314 is introduced into the distribution holes 331. Here, charged particles such as electrons or ions may be trapped in the shower head 330, and neutral particles that do not have an electrical charge such as oxygen radicals may be supplied onto the substrate 50 through the distribution holes 331.

The plasma supply part 340 is disposed above the process chamber 310 to produce and supply plasma. The plasma supply part 340 includes an oscillator 341, a waveguide tube 342, a dielectric tube 343, and a process gas supply part 344.

The oscillator 341 generates electromagnetic waves. The waveguide tube 342 connects the oscillator 341 to the dielectric tube 343 to provide a passage through which the electromagnetic waves generated in the oscillator 341 are transmitted into the dielectric tube 343. The process gas supply part 344 supplies a process gas into the dielectric tube 343. The process gas may include oxygen and nitrogen. Here, a fluorine-based gas may be added to improve adhesive removal efficiency. The process gas supplied into the dielectric tube 343 is excited into a plasma state by the electromagnetic waves. The plasma is introduced into the diffusion space 314 via the dielectric tube 343.

Figure 9:
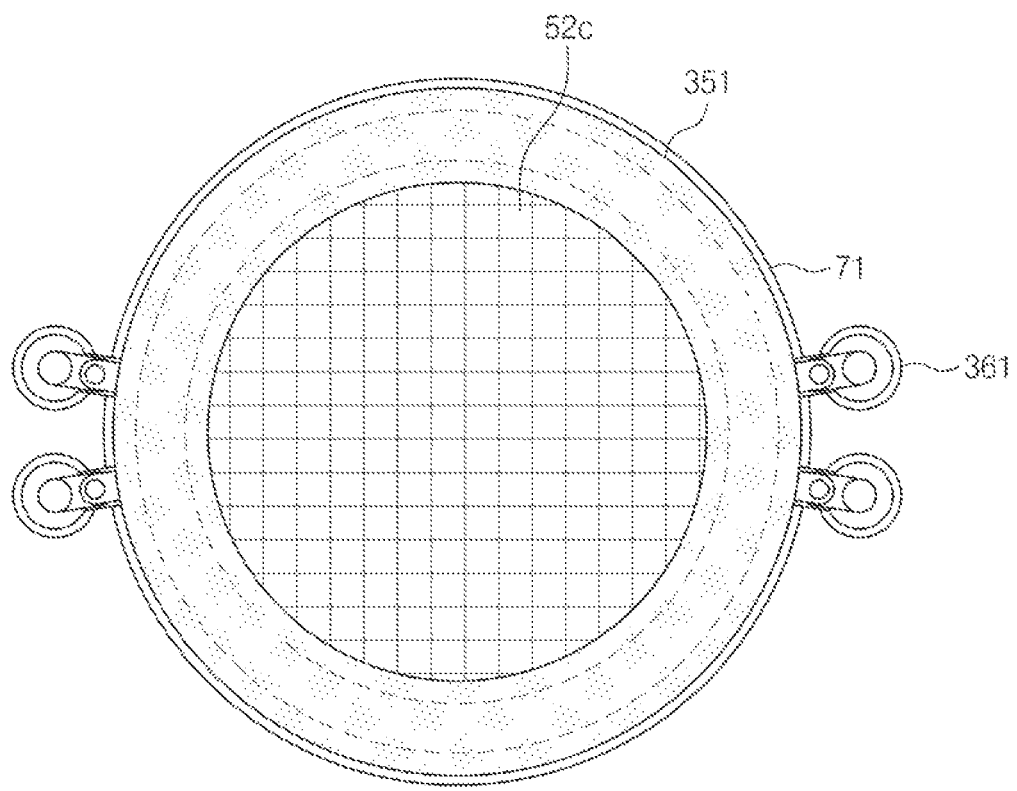
FIG. 9 is a plan view of a susceptor and a blocking member according to an embodiment of the present invention.
Figure 10:
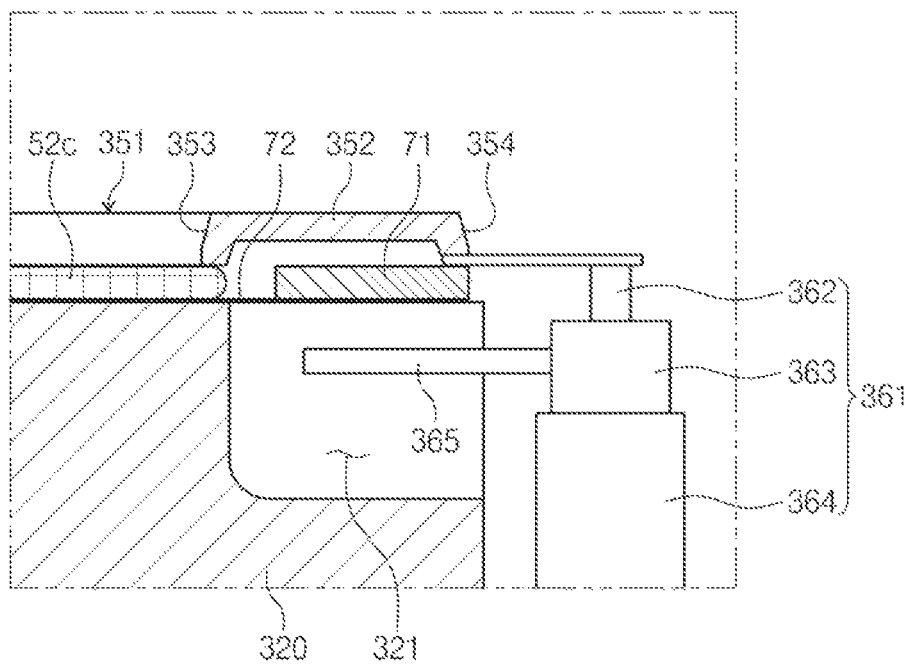
FIG. 10 is a view of the susceptor and the blocking member according to an embodiment of the present invention.

FIG. 9 is a plan view of the susceptor and the blocking member according to an embodiment of the present invention, and FIG. 10 is a view of the susceptor and the blocking member according to an embodiment of the present invention.

Referring to FIGS. 8 to 10, the blocking member prevents the mounting tape 71 from being exposed to the plasma. The blocking member 350 seats the substrate 50 on the top surface of the susceptor 320 and lifts the substrate 50 placed on the susceptor 320. The blocking member 350 includes a blocking ring 351 and an elevation member 355.

The blocking ring 351 is disposed above the susceptor 320 to cover a region between the wafer 52c and the frame ring 71. The blocking ring 351 is formed of a ceramic material. The blocking ring 351 has a ring shape. The blocking ring 351 may have an inner diameter less than a circumference of the wafer 52c and an outer diameter equal to or less than an outer diameter of the frame ring 71. The blocking ring may have a width that is capable of covering an area from an edge of the wafer 52c to an outer edge of the frame ring 71. The blocking ring 351 has a body 352, an inner portion 353, and an outer portion 354. The body 352 may have a ring shape and be disposed to face a region of the mounting tape 72 exposed to the outside. The body 352 is spaced a predetermined distance from the mounting tape 72. The inner portion 353 extends downward from the inside of the body 352 and has an end contacting the edge of the wafer 52c. The outer portion 354 extends downward from the outside of the body 352 and has an end contacting the frame ring 71. The blocking ring 351 may non-contact the mounting tape 71 to cover a region between the wafer 52c and the frame ring 71.

The blocking ring 351 prevents the mounting tape 72 from being exposed to the plasma. Since the blocking ring 351 has the inner portion 353 contacting the wafer 52c and the outer portion 354 contacting the frame ring 71, the introduction of the plasma toward the mounting tape 72 may be blocked. When the mounting tape 72 is exposed to the plasma, the mounting tape 72 may be elongated to cause difficulty in handling of the substrate 50 and also be deformed. The deformed tape 72 may be difficult in removal. Thus, the mounding tape 72 may not be completely removed to remain on the wafer 52c. Thus, the blocking ring 71 may prevent the mounting tape 72 from being exposed to the plasma to prevent the above-described limitation from occurring.

The elevation member 355 elevates the blocking ring 351. When the substrate 50 is placed on the susceptor 320 or lifted from the susceptor 320, the elevation member 355 may lift the blocking ring 351. Also, while the substrate 50 is placed on the susceptor 320, the elevation member 355 may fall the blocking ring 351 down to cover the mounting tape 72. The elevation member 355 includes a moving rod 361, the support piece 365, and a driver 368. The moving rod 361 supports the blocking ring 351 to elevate the blocking ring 351. According to an embodiment, the moving rod 361 may have a structure in which three rods 362 to 364 are connected to each other. The first rod 362 supports the blocking ring 351. The second rod 363 is disposed on a lower portion of the first rod 362 to support the first rod 362. Also, the second rod 363 has an inner space in which the first rod 362 is elevatable. The first rod 362 may vertically move and then be disposed inside and above the second rod 363.

The third rod 364 is disposed on a lower portion of the second rod 363 to support the second rod 363. Also, the third rod 364 has an inner space in which the second rod 363 is elevatable. The second rod 363 may vertically move and then be disposed inside and above the third rod 364.

The driver 368 may elevate the moving rod 361. In detail, the driver 368 may individually elevate the first rod 362 and the second rod 363. As the driver 368 is driven, the second rod 363 may be elevated with respect to the third rod 364, and the first rod 363 may be elevated with respect to the second rod 363.

The support piece 365 is coupled to the moving rod 361 and elevated together with the moving rod 361. According to an embodiment, the support piece 365 is coupled to the second rod 363. The support piece 365 may extend from the second rod 363 toward the susceptor 320, and thus an end of the support piece 365 may be disposed in the accommodation space 321. As the second rod 363 moves, the support piece 365 may be elevated along the accommodation space 321. When the support piece 365 is disposed above the accommodation space 321, the frame ring 71 is seated. In the frame ring 71 is seated on the support piece 365, the substrate 50 descends together with the support piece 365. While the support piece 365 descends, the substrate 50 is placed on the top surface of the susceptor 320. On the other hand, when the support piece 365 moves from the inside of the accommodation space 321 toward an upper side of the accommodation space 321, the frame ring 71 is placed on the support piece 365. While the support piece 365 ascends, the substrate 50 picks up from the susceptor 320.

Hereinafter, a method for treating a substrate by using the above-described substrate treatment apparatus will be described.

The hand part 223 of the first transfer robot 220 enters into the carrier 100 to grasp the frame ring 71. In the state where the lower hand 224 of the hand part 223 is disposed under the frame ring 781, the upper hand 225 presses the frame ring 71 to grasp the substrate 50. The hand part 223 is retreated in the state where the hand part 223 grasps the substrate 50. Then, the first transfer robot 220 may transfer the substrate 50 to accommodate the substrate 50 in the loadlock chamber 230.

The second transfer robot 250 may unload the substrate 50 in the state where the hand part 251 grasps the frame ring 71 of the substrate 50 accommodated in the loadlock chamber 230. The second transfer robot 250 may transfer the substrate 50 in the state where the hand part 251 grasps the substrate 50 into the process chamber 310.

The first and second rods 362 and 363 are elevated within the process chamber 310, and then the support piece 365 stands by. The frame ring 71 of the substrate 50 is seated on the support piece 365. In the state where the substrate 50 is supported by the support piece 365, the second rod 363 descends. While the support piece 365 together with the second rod 363 descends, the substrate 50 is seated on the susceptor 320. Thereafter, the blocking ring 351 together with the first rod 363 may descend to cover the mounting tape 72.

The plasma supply part 340 may generate plasma to supply the plasma into the process chamber 310. The process gas is supplied from the process gas supply part 344 into the dielectric tube 343, and the electromagnetic waves generated in the oscillator 341 are transmitted into the dielectric tube 343 through the waveguide tube 342. The electromagnetic waves excite the process gas into a plasma state. The plasma is introduced into the diffusion space 314 and then introduced into the process chamber 310 via the diffusion space 314 and the distribution holes 331 of the shower head 330. The plasma is supplied onto the top surface of the wafer 52c. Here, the plasma is not introduced into the mounting tape 72 by the blocking ring 351. The plasma removes the adhesive adhering to the top surface of the wafer 52c. The gas staying in the process chamber 310 and the byproducts are introduced into the exhaust hole 411 via holes of an exhaust plate 410 and then are exhausted to the outside.

When the treatment process is completed, the first and second rods 362 and 363 ascend. While the support piece 365 together with the second rod 363 ascends, the substrate 50 is lifted from the susceptor 320. While the substrate 50 is supported by the support piece 365, the hand part 251 of the second transfer robot 250 enters into the process chamber 310 to grasp the frame ring 71. The second transfer robot 250 unloads the substrate 50 from the process chamber 310 to transfer and accommodate the substrate into the loadlock chamber 230.

The hand part 223 of the first transfer robot 220 grasps the frame ring 71 of the substrate 50 accommodated in the loadlock chamber 230 to transfer and accommodate the substrate 50 into the carrier 100.

Figure 11:
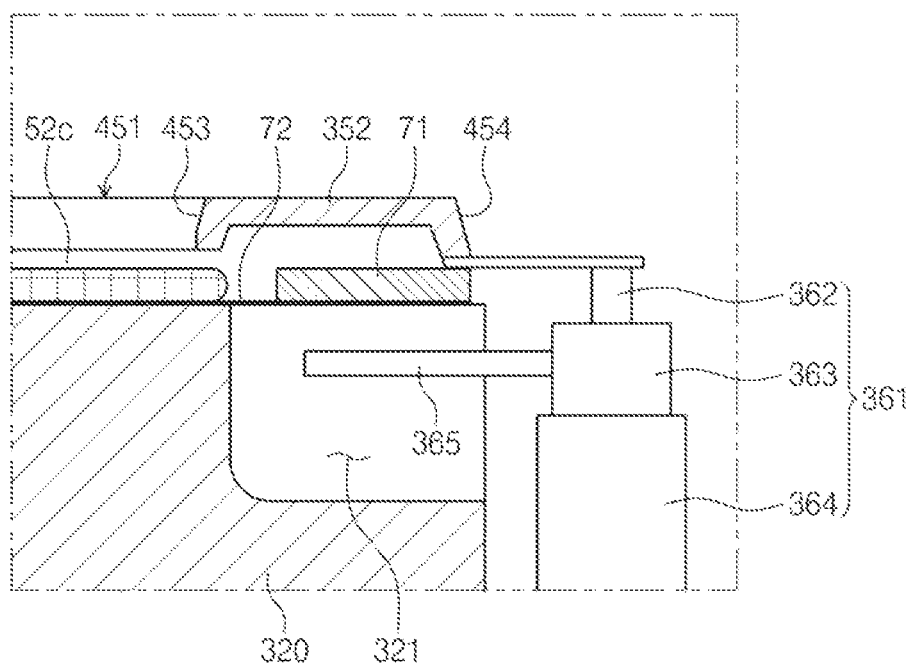
FIG. 11 is a view of a blocking member according to another embodiment of the present invention.

FIG. 11 is a view of a blocking member according to another embodiment of the present invention.

Referring to FIG. 11, an inner end 453 of a blocking ring 451 is spaced a predetermined distance from a top surface of a wafer 52c. The blocking ring 451 covers a region between the wafer 52c and a frame ring 71 to prevent a mounting tape 72 from being exposed to plasma.

Referring again to FIG. 3, according to the foregoing embodiments, the wafer 51b is attached to the mounting tape 72 after the molding process 63. Thereafter, the carrier 54 is removed, and then the process of removing the adhesive 55a remaining on the wafer 51c is performed. On the other hand, the removing of the adhesive 55a may be performed before the chip bonding process 61. According to the embodiments, the carrier 54 may adhere to the FEOL wafer 51 to perform the back grinding process. Then, the carrier 54 may be removed in the state where the wafer 51a is attached to the mounting tape 72, and then the adhesive 55a remaining on the wafer 51a may be removed. Thereafter, the chip bonding process 61, the underfill process 62, and the molding process 63 may be successively performed.

According to the embodiments of the present invention, the adhesive remaining on the wafer after the carrier is removed may be completely removed.

Also, according to the embodiments of the present invention, the mounting tape may not be exposed to the plasma to prevent the mounting tape from being deformed.

Also, according to the embodiments of the present invention, since the transfer robot transfers the substrate in the state where the transfer robot grasps the substrate in the tong manner, the wafer may be easily handled.

The above detailed description exemplifies the present invention. Further, the above contents just illustrate and describe preferred embodiments of the present invention and the present invention can be used under various combinations, changes, and environments. That is, it will be appreciated by those skilled in the art that substitutions, modifications and changes may be made in these embodiments without departing from the principles and spirit of the general inventive concept, the scope of which is defined in the appended claims and their equivalents. The above-mentioned embodiments are used to describe a best mode in implementing the present invention. The present invention can be implemented in a mode other than a mode known to the art by using another invention and various modifications required a detailed application field and usage of the present invention can be made. Therefore, the detailed description of the present invention does not intend to limit the present invention to the disclosed embodiments. Further, the appended claims should be appreciated as a step including even another embodiment.

What is claimed is:

1. A substrate treatment apparatus comprising:
   a frame ring having an opening formed in a middle of the frame ring, and including a mounting tape fixedly attached to the frame ring across the opening, wherein a back-ground wafer is placed on the mounting tape;
   a load port on which a carrier accommodating a plurality of substrates to which the back-ground wafer is attached is placed;
   a plasma treatment unit supplying plasma to treat a top surface of the back-ground wafer; and
   a substrate transfer unit transferring a substrate between the load port and the plasma treatment unit,
   wherein the plasma treatment unit comprises:
      a process chamber having an inner space;
      a susceptor disposed within the process chamber to support each of the substrates;
      a plasma supply part supplying plasma into the process chamber; and
      a blocking member covering the mounting tape to prevent the mounting tape from being exposed to the plasma,
   wherein the blocking member comprises:
      a blocking ring covering a region between the wafer and the frame ring, the blocking ring non-contacting the mounting tape; and
      an elevation member elevating the blocking ring,
   wherein the elevation member comprises:
      a first rod supporting the blocking ring;
      a second rod disposed on a lower portion of the first rod to support the first rod, the second rod having an inner space in which the first rod is elevatable;
      a third rod disposed on a lower portion of the second rod to support the second rod, the third rod having an inner space in which the second rod is elevatable; and
      a driver individually driving the first and second rods,
   wherein a support piece for seating the substrate on the susceptor in a state where the support piece supports the frame ring is disposed on the second rod, and
   an accommodation space in which the support piece is vertically movable is defined in an edge of the susceptor.

2. The substrate treatment apparatus of claim 1, wherein the blocking ring comprises:
   a body having a ring shape to face the mounting tape;
   an inner portion extending downward from an inside of the body, the inner portion having an end contacting an edge of the back-ground wafer; and
   an outer portion extending downward from the outside of the body, the outer portion having an end contacting the frame ring.

3. The substrate treatment apparatus of claim 1, wherein the blocking ring comprises:
   a body having a ring shape to face the mounting tape;

an inner portion extending downward from the inside of the body, the inner portion being spaced a predetermined distance from the top surface of the wafer; and an outer portion extending downward from the outside of the body, the outer portion having an end contacting the frame ring.

4. The substrate treatment apparatus of claim 2, wherein the blocking ring has a width that covers a region from the edge of the back-ground wafer to an outer edge of the frame ring.

5. The substrate treatment apparatus of claim 1, wherein the blocking ring is formed of a ceramic material.

6. The substrate treatment apparatus of claim 1, wherein the accommodation space is defined inward from an outer surface of the susceptor up to a point at which an edge of the back-ground wafer is disposed.

7. The substrate treatment apparatus of claim 1, wherein the substrate transfer unit comprises a transfer robot comprising a hand part for grasping a portion of the frame ring in a tong manner, the transfer robot transferring the substrate.

8. The substrate treatment apparatus of claim 7, wherein the hand part comprises:

a lower hand on which a portion of the frame ring is placed;

an upper hand disposed above the lower hand, the upper hand pressing the frame ring placed on the lower hand to fix the frame ring; and a driver moving the upper hand so that the upper hand is spread or folded with respect to the lower hand.

9. The substrate treatment apparatus of claim 8, wherein a front end of the lower hand has an arc shape having the same curvature as the frame ring.

* * * * *